US009236006B2

United States Patent
Lee et al.

(10) Patent No.: US 9,236,006 B2
(45) Date of Patent: Jan. 12, 2016

(54) DISPLAY DEVICE AND METHOD OF DRIVING THE SAME

(71) Applicant: ELECTRONICS AND TELECOMMUNICATIONS RESEARCH INSTITUTE, Daejeon (KR)

(72) Inventors: Hyunkoo Lee, Daejeon (KR); Jae-Eun Pi, Gyeonggi-do (KR); Chi-Sun Hwang, Daejeon (KR); Jong-Heon Yang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 16 days.

(21) Appl. No.: 14/208,624

(22) Filed: Mar. 13, 2014

(65) Prior Publication Data
US 2015/0084995 A1 Mar. 26, 2015

(30) Foreign Application Priority Data
Sep. 24, 2013 (KR) .................. 10-2013-0113396

(51) Int. Cl.
*G09G 3/30* (2006.01)
(52) U.S. Cl.
CPC ............ *G09G 3/30* (2013.01); *G09G 2310/024* (2013.01)

(58) Field of Classification Search
CPC ................ G09G 2300/0456; G09G 2300/046; G09G 2360/14; G09G 2360/141; G09G 2360/144
See application file for complete search history.

(56) References Cited

U.S. PATENT DOCUMENTS

| | | | |
|---|---|---|---|
| 2003/0103021 A1* | 6/2003 | Young et al. ..................... | 345/76 |
| 2007/0075935 A1* | 4/2007 | Mesmer et al. ................. | 345/76 |

FOREIGN PATENT DOCUMENTS

| | | |
|---|---|---|
| KR | 10-0272046 B1 | 11/2000 |
| KR | 10-0525257 B1 | 11/2005 |
| KR | 10-0623222 B1 | 9/2006 |
| KR | 10-0630475 B1 | 10/2006 |
| KR | 10-0656133 B1 | 12/2006 |
| KR | 10-0656718 B1 | 12/2006 |
| KR | 10-2012-0100440 | 9/2012 |

* cited by examiner

*Primary Examiner* — Ilana Spar
(74) *Attorney, Agent, or Firm* — Rabin & Berdo, P.C.

(57) ABSTRACT

Provided is a display device. The display device includes: a pixel including an emissive element circuit, a reflective element circuit, and a switch transistor selecting one of the emissive element circuit and the reflective element circuit; an illumination sensor generating an illumination information signal according to an illumination of an external light source by detecting the external light source; and a controller generating control signals for driving the pixel according to pixel data, wherein the controller generates a light signal controlling the switch transistor by referencing the illumination information signal.

11 Claims, 6 Drawing Sheets

# DISPLAY DEVICE AND METHOD OF DRIVING THE SAME

CROSS-REFERENCE TO RELATED APPLICATIONS

This U.S. non-provisional patent application claims priority under 35 U.S.C. §119 of Korean Patent Application No. 10-2013-0113396, filed on Sep. 24, 2013, the entire contents of which are hereby incorporated by reference.

BACKGROUND OF THE INVENTION

The present invention disclosed herein relates to a display device, and more particularly, to a display device including an emissive element and a reflective element and its driving method.

As information and communication industries are developed drastically, display devices usage is increased. Recently, display devices satisfying requirements such as lower power, lightweight, thin thickness and high resolution are required. According to these requirements, a liquid crystal display or an organic light emitting display using organic light emitting characteristics is under development.

The organic light emitting display is a next generation display device having a self light emitting property. Compared to the liquid crystal display, the organic light emitting display shows excellent performances in terms of viewing angle, contrast ratio, response time, and power consumption. Additionally, since the organic light emitting display does not require a backlight, it may be manufactured to be lightweight and compact.

The organic light emitting display shows excellent contrast performance compared to the liquid crystal display. However, when an external light source of more than a predetermined intensity is incident, the organic light emitting display's visibility may be deteriorated. In order to improve this, a reflective-emissive complex display device realized by combining an organic light emitting mode and a reflective liquid crystal mode was suggested before.

SUMMARY OF THE INVENTION

The present invention provides a display device driven by efficiently selecting a reflective element and an emissive element according to an external illumination environment and its driving method in relation to a display device selectively driving a reflective element and an emissive element.

Embodiments of the present invention provide display devices include: a pixel including an emissive element circuit, a reflective element circuit, and a switch transistor selecting one of the emissive element circuit and the reflective element circuit; an illumination sensor generating an illumination information signal according to an illumination of an external light source by detecting the external light source; and a controller generating control signals for driving the pixel according to pixel data, wherein the controller generates a light signal controlling the switch transistor by referencing the illumination information signal.

In some embodiments, the controller may compare a preset reference value with the illumination of the external light source.

In other embodiments, when the illumination of the external light source is greater than the reference value, the controller may generate the light signal to allow the switch transistor to select the reflective element circuit.

In still other embodiments, when the illumination of the external light source is less than the reference value, the controller may generate the light signal to allow the switch transistor to select the emissive element circuit.

In even other embodiments, the reflective element circuit may be connected to a source of the switch transistor.

In yet other embodiments, when the illumination of the external light source is greater than the reference value, the light signal may be inputted to a gate of the switch transistor as a high level to turn on the switch transistor thereby driving the reflective element circuit.

In further embodiments, when the illumination of the external light source is less than the reference value, the light signal may be inputted to a gate of the switch transistor as a low level to turn off the switch transistor thereby blocking the reflective element circuit.

In other embodiments of the present invention, provided are methods of driving a display device including a switch transistor, an emissive element circuit, and a reflective element circuit. The methods include: measuring an illumination of an external light source by detecting the external light source; comparing a preset reference value with the illumination of the external light source; according to a comparison result, generating a light signal for controlling the switch transistor; selecting one of the emissive element circuit and the reflective element circuit in response to the light signal; and driving the selected one of the emissive element circuit and the reflective element circuit.

In some embodiments, the comparing of the preset reference value with the illumination of the external light source may include, when the illumination of the external light source is greater than the reference value, selecting the reflective element circuit by the switch transistor.

In some embodiments, the comparing of the preset reference value with the illumination of the external light source may include, when the illumination of the external light source is less than the reference value, selecting the emissive element circuit by the switch transistor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
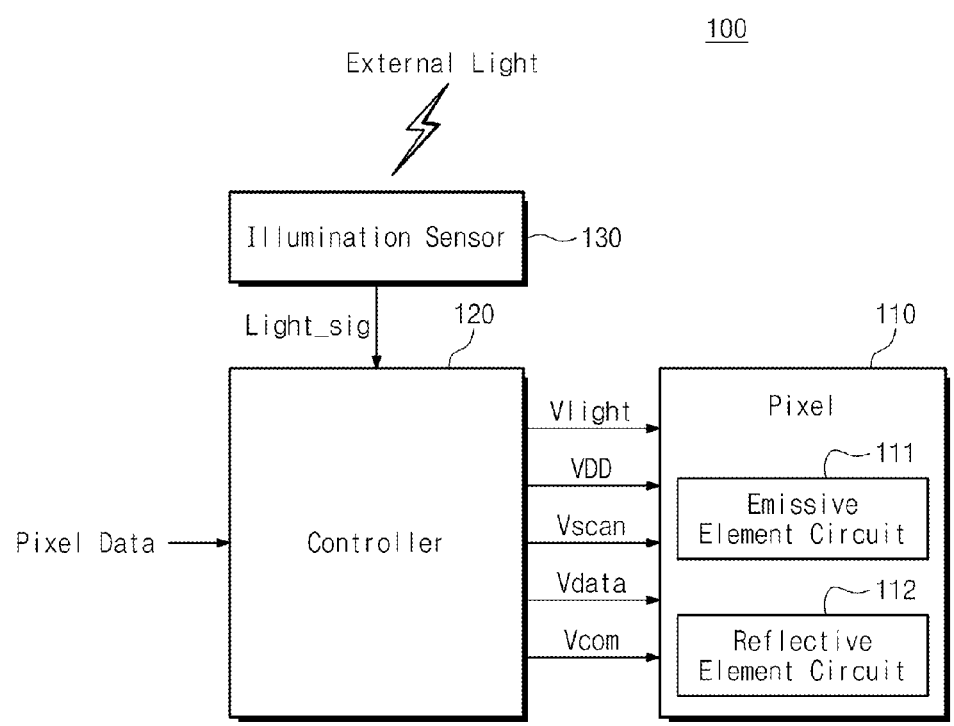
FIG. 1 is a block diagram illustrating a display device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

Hereinafter, a display device is used as one example for illustrating characteristics and functions of the present invention. However, those skilled in the art can easily understand other advantages and performances of the present invention according to the descriptions. The present invention may be embodied or applied through other embodiments. Besides, the detailed description may be amended or modified according to viewpoints and applications, not being out of the scope, technical idea and other objects of the present invention.

FIG. 1 is a block diagram illustrating a display device according to an embodiment of the present invention. Referring to FIG. 1, a controller 120 generates driving signals Vlight, VDD, Vscan, Vdata, and Vcom according to an illumination of an external light detected by an illumination sensor 130 so as to operate a pixel 110 in the display device. FIG. 1 illustrates one pixel 110 exemplarily. However, the display device 100 may include a plurality of pixels. Additionally, the plurality of pixels may form a panel (not shown) having an array structure.

The pixel 110 may display pixel data received by the controller 120. The pixel 110 may include a switch transistor controlled by a light signal Vlight. The pixel 110 may include a emissive element circuit 111 and an reflective element circuit 112. The emissive element circuit 111 and the reflective element circuit 112 may be selectively driven by the light signal Vlight. The light signal Vlight is generated to selectively drive the emissive element circuit 111 and the reflective element circuit 112 according to an illumination of an external light source.

The controller 120 may receive pixel data. The controller 120 may generate signals Vlight, VDD, Vscan, Vdata, and Vcom for controlling the pixel 110 according to the received pixel data. The pixel 110 may operate according to the generated signals Vlight, VDD, Vscan, Vdata, and Vcom. The controller 120 may receive an illumination information signal Light_sig from the illumination sensor 130. The illumination information signal Light_sig may have information on an illumination of an external light source. The controller 120 may generate the light signal Vlight according to the received illumination information signal Light_sig. The controller 120 may store a predetermined reference value. When an illumination of an external light source is greater than a reference value, according to the illumination information signal Light_sig, the controller 120 may generate the light signal Vlight to operate the reflective element circuit 112 of the pixel 110. When an illumination of an external light source is less than a reference value, according to the illumination information signal Light_sig, the controller 120 may generate the light signal Vlight to operate the emissive element circuit 111.

The illumination sensor 130 may detect external light source. The illumination sensor 130 may generate the illumination information signal Light_sig according to the illumination of the detected external light source. The illumination sensor 130 may transmit the generated illumination information signal Light_sig to the controller 120.

As described above, the display device 100 may selectively drive the emissive element circuit 111 and the reflective element circuit 112 included in the pixel 110 according to an illumination of an external light source by detecting the external light source. The emissive display device has a high visibility in a dark external environment. However, the visibility of the emissive display device is deteriorated in a bright external environment. In order to improve the visibility of the emissive display device in a bright external environment, much power is consumed. On the contrary, a reflective display device has a high visibility in a bright external environment compared to a dark external environment. Accordingly, when the emissive element circuit 111 and the reflective element circuit 112 are selectively driven according to an illumination of an external light source, the visibility of the display device 100 may be improved. Additionally, the power consumption of the display device 100 may be reduced.

Figure 2:
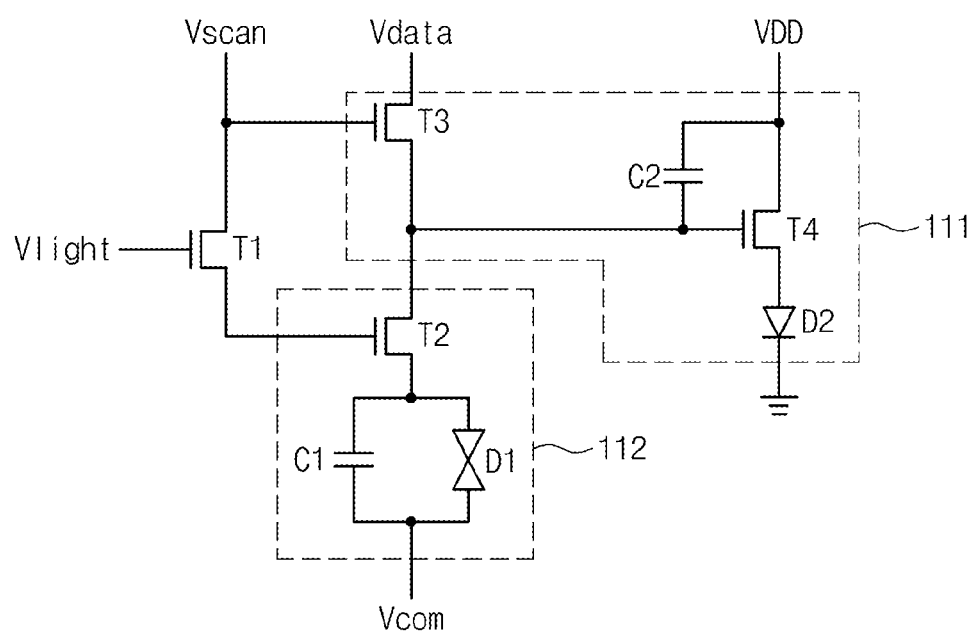
FIG. 2 is a circuit diagram illustrating a pixel of FIG. 1.

FIG. 2 is a circuit diagram illustrating a pixel of FIG. 1. Referring to FIG. 2, the pixel 110 may include an emissive element circuit 111 and a reflective element circuit 112. FIG. 2 exemplarily illustrates one pixel 110 among pixels of a panel (not shown) included in the display device 100 of FIG. 1.

The emissive element circuit 111 and the reflective element circuit 112 included in the pixel 110 may operate selectively according to an external illumination environment. Hereinafter, the case that the emissive element circuit 111 operates and the case that the reflective element circuit 112 operates are separately described. In FIG. 2, exemplarily, transistors T1, T2, T3, and T4 are shown as N-type transistors. However, those skilled in the art may easily understand that the transistors T1, T2, T3, and T4 are not limited to the N-type transistors.

First, when an illumination of an external light source is less than a reference value, only the emissive element circuit 111 of the pixel 110 may operate. When an illumination of an external light source is less than a reference value, a light signal Vlight may have a low level. The light signal Vlight may be applied to the gate of the first transistor T1. Once a signal of a low level is applied to the gate of the first transistor T1, the first transistor T1 may be turned off. The source of the first transistor T1 may be connected to the gate of the second transistor T2. When the first transistor T1 is turned off, the second transistor T2 may be turned off. When the second transistor T2 is turned off, the pixel may operate as a pixel of basic emissive display device including the two transistors T3 and T4 and one capacitor C2.

A scan signal Vscan may be applied to the gate of the third transistor T3. The scan signal Vscan may be a signal in a pulse form changing from a low level into a high level in a constant period. A data signal Vdata may be applied to the drain of the third transistor T3. The data signal Vdata may be a signal in a pulse form changing from a middle level into a high level. For example, when an emissive element D2 is an organic light emitting diode OLED, the data signal Vdata may be a signal in a pulse form changing from a ground level into a high level. The data signal Vdata may be synchronized with the scan signal Vscan and applied. When third transistor T3 is turned on in response to the scan signal Vscan, the data signal Vdata may be applied to the gate of the fourth transistor T4. In this case, an emission signal VDD may have a high level. When the fourth transistor T4 is turned on in response to the data signal Vdata, the emissive element D2 may be driven in response to the emission signal VDD.

Secondary, when an illumination of an external light source is greater than a reference value, only the reflective element circuit 112 of the pixel 110 may operate. When an illumination of an external light source is greater than a reference value, a light signal Vlight may have a high level. The light signal Vlight may be applied to the gate of the first transistor T1. Once a signal of a high level is applied to the gate of the first transistor T1, the first transistor T1 may be turned on. The source of the first transistor T1 may be connected to the gate of the second transistor T2. When the first transistor T1 is turned on, the second transistor T2 may be turned on or off in response to the scan signal Vscan. When the second transistor T2 is turned on, the pixel may operate as a pixel of basic reflective display device including one transistor T2 and one capacitor C1.

A scan signal Vscan may be applied to the gate of the third transistor T3. The scan signal Vscan may be a signal in a pulse form changing from a low level into a high level in a constant period. In response to the scan signal Vscan, the second transistor T2 and the third transistor T3 may be turned on or turned off. A data signal Vdata may be applied to the drain of the third transistor T3. The data signal Vdata may be a signal in a pulse form for operating a reflective element D1. The data signal Vdata may be synchronized with the scan signal Vscan and applied. A common signal Vcom may have a level for operating the reflective element D1. For example, when an inversion method is used, the common signal Vcom may be a specific level between a high level and a low level. When the second transistor T2 and the third transistor T3 are turned on in response to a scan signal Vscan, the reflective element D1 may be driven in response to the data signal Vdata. In this case, the emission signal VDD may have a low level. When the emission signal VDD is a ground level, the emission element D2 may not operate. Accordingly, when an illumination of an external light source is greater than a reference value, only the reflective element D1 is driven.

As mentioned above, the reflective element D1 and the emissive element D2 of the pixel 110 may be selectively driven by the light signal Vlight. The first transistor T1 turned on or off in response to the light signal Vlight may serve as a switch. The emissive element circuit 111 and the reflective element circuit 112 may share a wire of a scan signal Vscan by such a first transistor T1. Additionally, the emissive element circuit 111 and the reflective element circuit 112 may share a wire of a data signal Vdata. Accordingly, the number of wires necessary for the pixel 110 may be reduced. If an area due to wiring is reduced, the opening ratio of a pixel may be improved. Once the opening ratio of a pixel is improved, the visibility of the display device 100 may be improved.

Figure 3:
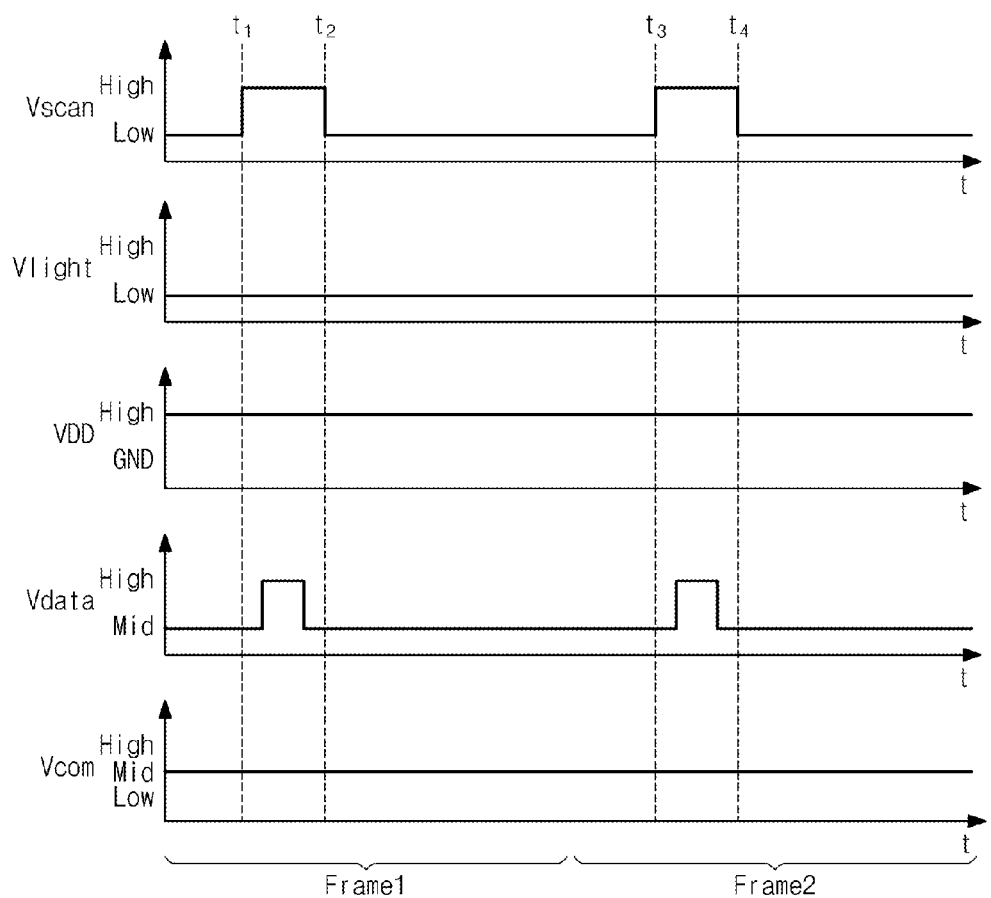
FIG. 3 is a timing diagram illustrating operation signals applied to the pixel of FIG. 2 when an emissive element is driven.

FIG. 3 is a timing diagram illustrating operation signals applied to the pixel of FIG. 2 when an emissive element is driven. Referring to FIGS. 1 to 3, when an illumination of an external light source is less than a reference value, only the emissive element D3 of the pixel 110 is driven. For example, the emissive element D2 may be an electro luminescence element. In FIG. 3, for example, operation signals Vscan, Vlight, VDD, Vdata, and Vcom are applied during a first frame Frame1 and a second frame Frame2. However, the operation signals Vscan, Vlight, VDD, Vdata, and Vcom may be applied during a plurality of frames.

The illumination sensor 130 may detect an external light source. The illumination sensor 130 may transmit the illumination information signal Light_sig to the controller 120 according to an external light source. The controller 120 may compare an illumination of an external light source with a reference value in response to the illumination information signal Light_sig. According to a comparison result, if the illumination of the external light source is less than the reference value, the controller 120 may generate a light signal Vlight of a low level Low. The light signal Vlight of the low level Low may be transmitted to the gate of the first transistor T1. By the light signal Vlight of the low level Low, the first transistor T1 may be turned off. When the first transistor T1 is turned off, the second transistor T2 may be turned off. When the second transistor T2 is turned off, the reflective element D1 may not be driven. Accordingly, the first transistor T1 may serve as a switch for selectively driving the emissive element D2.

The controller 120 may generate a scan signal Vscan having a constant period. The scan signal Vscan may be a signal in a pulse form changing from a low level Low to a high level High in a constant period. During the first frame Frame1, a scan signal Vscan may have a high level High between a time t1 and a time t2. After a constant period, during the second frame Frame2, the scan signal Vscan may have a high level High between a time t3 and a time t4. While the scan signal Vscan is a high level High (t1 to t2 and t3 to t4), the third transistor T3 may be turned on. Accordingly, the controller 120 may generate the data signal Vdata in synchronization with the scan signal Vscan according to the received pixel data. According to the data signal Vdata, the fourth transistor T4 may be turned on. When an illumination of an external light source is less than a reference value, the controller 120 may generate the emission signal VDD of a high level High. Accordingly, during each of the frames Frame1 and Frame2, the emissive element D2 may be driven according to the data signal Vdata.

Figure 4:
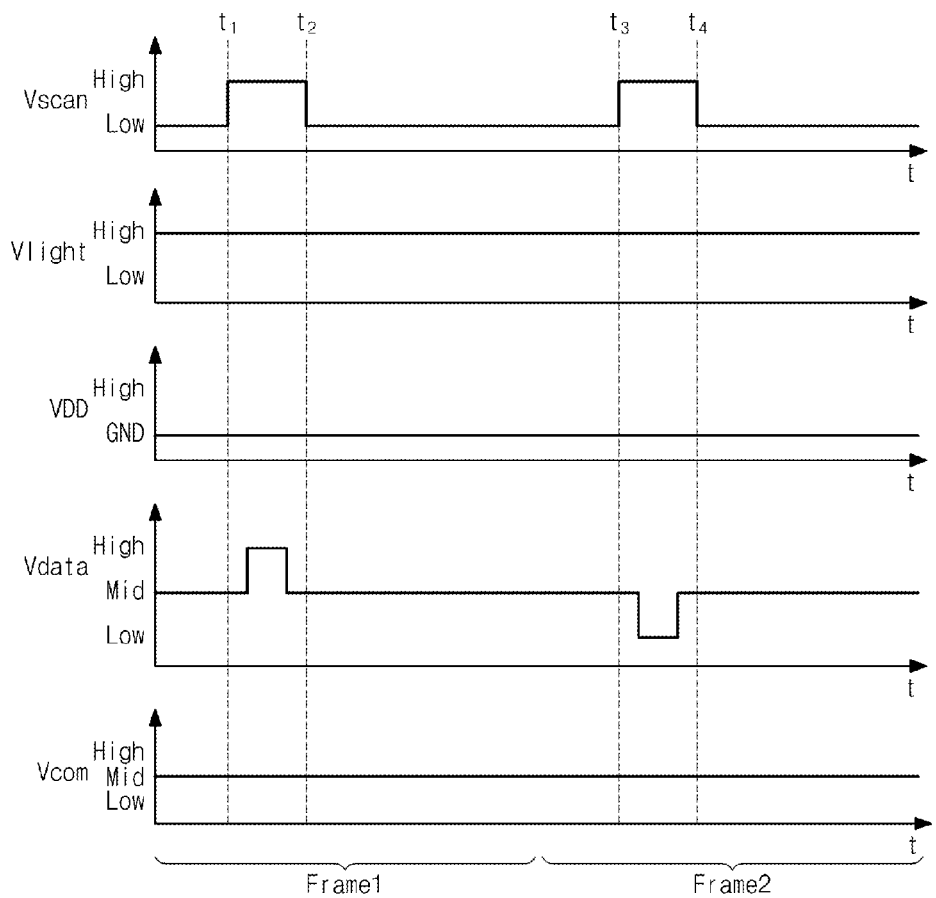
FIG. 4 is a timing diagram illustrating operation signals applied to the pixel of FIG. 2 when a reflective element is driven.

FIG. 4 is a timing diagram illustrating operation signals applied to the pixel of FIG. 2 when a reflective element is driven. Referring to FIGS. 1, 2, and 4, when an illumination of an external light source is greater than a reference value, only the reflective element D1 of the pixel 110 may be driven. For example, the reflective element D1 may be a liquid crystal element. In FIG. 4, for example, during the first frame Frame1 and the second frame Frame2, operation signals Vscan, Vlight, VDD, Vdata, and Vcom are applied. However, the operation signals Vscan, Vlight, VDD, Vdata, and Vcom may be applied during a plurality of frames.

The illumination sensor 130 may detect an external light source. The illumination sensor 130 may transmit the illumination information signal Light_sig to the controller 120 according to an external light source. The controller 120 may compare an illumination of an external light source with a reference value in response to the illumination information signal Light_sig. According to a comparison result, if the illumination of the external light source is greater than the reference value, the controller 120 may generate a light signal Vlight of a high level High. The light signal Vlight of the high level High may be transmitted to the gate of the first transistor T1. By the light signal Vlight of the high level High, the first transistor T1 may be turned on. When the first transistor T1 is turned on, the second transistor T2 may be turned on or off in response to the scan signal Vscan. When the second transistor T2 is turned on, the liquid crystal element may be driven. Accordingly, the first transistor T1 may serve as a switch for selectively driving the reflective element D1.

The controller 120 may generate a scan signal Vscan having a constant period. The scan signal Vscan may be a signal in a pulse form changing from a low level Low to a high level High in a constant period. During the first frame Frame1, a scan signal Vscan may have a high level High between a time t1 and a time t2. After a constant period, during the second frame Frame2, the scan signal Vscan may have a high level High between a time t3 and a time t4. While the scan signal Vscan is a high level High (t1 to t2 and t3 to t4), the second transistor T2 may be turned on. Accordingly, the controller 120 may generate the data signal Vdata in synchronization with the scan signal Vscan according to the received pixel data. While the second transistor T2 is turned on, (t1 to t2 or t3 to t4), the reflective element D1 may be driven according to the data signal Vdata.

For example, when the reflective element D1 is a liquid crystal element, the controller 120 may generate the data signal Vdata inverted due to the characteristic of a liquid crystal element. The controller 120 may generate a data signal Vdata to be driven through a dot inversion, column inversion, line inversion, or frame inversion method. Accordingly, the data signal Vdata may have a high level High pulse during the first frame Frame1 and then may have a low level Low pulse during the second frame Frame2. According thereto, the controller 120 may generate a common signal Vcom having a constant level between a low level Low and a high level High. The common signal Vcom may be applied to the first capacitor C1 and one side node of a liquid crystal element.

When an illumination of an external light source is greater than a reference value, the controller 120 may generate an emission signal VDD of a ground level. Accordingly, the emissive element D2 may not be driven regardless of a data signal Vdata. Therefore, when an illumination of an external light source is greater than a reference value, only the reflective element D1 of the pixel 110 may be selectively driven.

Figure 5:
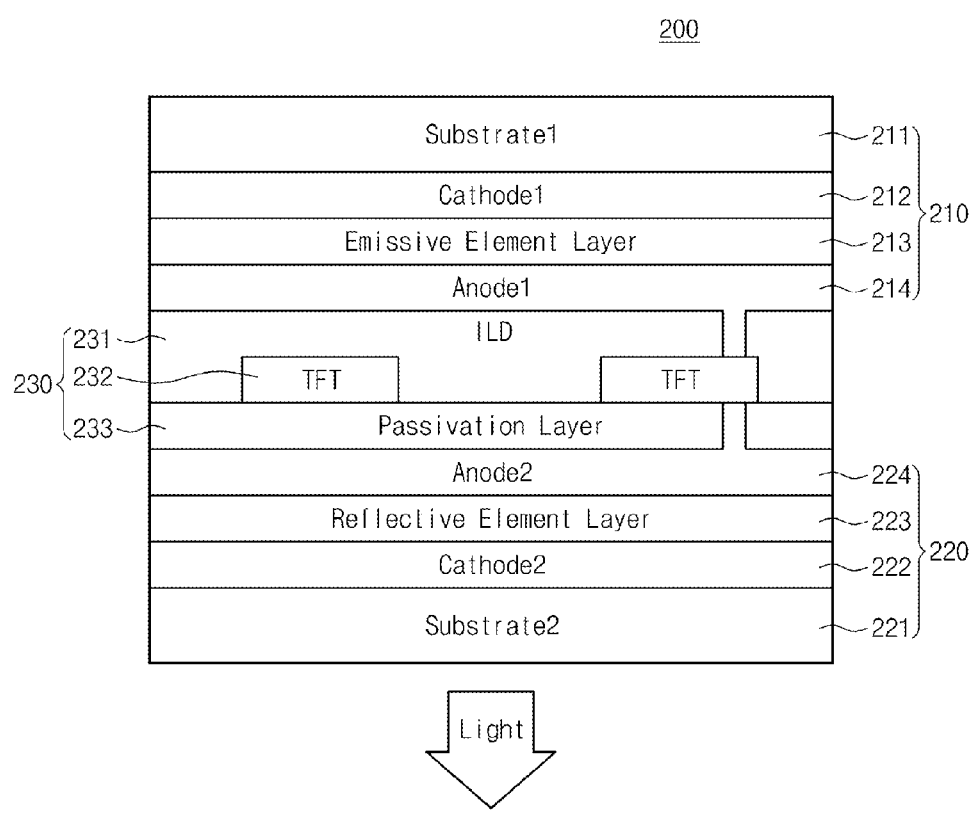
FIG. 5 is a sectional view illustrating a stacked layer structure of a pixel according to an embodiment of the present invention.

FIG. 5 is a sectional view illustrating a stacked layer structure of a pixel according to an embodiment of the present invention. Referring to FIG. 5, the pixel 200 includes an emissive element part 210, a reflective element part 220, and a thin film transistor part 230.

The emissive element part 210 includes a first substrate, a first cathode electrode 212, an emissive element layer 213, and a first anode electrode 214. The first substrate 211 may be formed of an insulating substrate. For example, the first substrate 211 may be formed of a glass substrate. However, since the first substrate 211 is not a display part, it may use an opaque material. The first cathode electrode 212 and the first anode electrode 214 are electrodes for driving the emissive element layer 213. The first cathode electrode 212 may be used as a reflective plate when a reflective element is driven. For example, the first cathode electrode 212 may be formed of a metal such as Ca, Mg, or Al and an alloy thereof, graphene, and a metal nanowire. The first anode electrode 214 may be formed of a transparent electrode material. The reason is that a light generated from the emissive element layer 213 needs to pass through the first anode electrode 214. For example, the first anode electrode 214 may be formed of ITO, IZO, TCO, graphene, or a metal nanowire.

The emissive element layer 213 may be formed between the first cathode electrode 212 and the second anode electrode 214. The emissive element layer 213 may include an emissive element. The emissive element is an element emitting light by a current supplied through the first cathode electrode 212 and the first anode electrode 214. For example, the emissive element may be an organic EL element. The emissive element layer 213 may be formed through a deposition method, a spin coating method, a roller coating method, or an ink jet method.

The reflective element part 220 includes a second substrate 221, a second cathode electrode 222, a reflective element layer 223, and a second anode electrode 224. The second substrate 221 may be a substrate at the display side of the pixel 200. The second substrate 221 may be formed of an insulating substrate. For example, the second substrate 221 may be formed of a transparent glass substrate or plastic substrate. The cathode electrode 222 and the second anode electrode 224 may be formed of a transparent electrode. For example, the second cathode electrode 222 and the second anode electrode 224 may be formed of ITO, IZO, TCO, graphene, or a metal nanowire. The second cathode electrode 222 and the second anode electrode 224 are electrodes for driving the reflective element layer 223.

The reflective element layer 223 may be formed between the second cathode electrode 222 and the second anode electrode 224. The reflective element layer 223 may be formed of a reflective element. For example, the reflective element layer 223 may be formed of a nematic, smectic, or cholesteric liquid crystal material. The cholesteric liquid crystal material may have a feature that reflects light according to voltage. Accordingly, the reflective element layer 223 is formed of a cholesteric liquid crystal material, the pixel 200 may use the reflective element layer 223 as a reflective plate.

The thin film transistor part 230 includes the transistors T1, T2, T3, T4 of FIG. 2 for driving the emissive element layer 213 and the reflective element layer 223. For example, the thin film transistor 232 may be formed of a silicon thin film transistor or an oxide thin film transistor. The thin film transistor 232 may be deposited on the passivation layer 233 and formed. The passivation layer 233 may be formed of a transparent insulating material. An inter layer dielectric 231 may serve to separate the thin film transistor 232 from the first anode electrode 214. For example, the inter layer dielectric 231 may be formed of transparent SiNx or SiOx.

Layers of the pixel 200 may be connected to each other through a via (not shown). For example, the via may be formed of ITO, IZO, TCO, graphene, or a metal nanowire. All layers of the pixel 200 except for the reflective plate may be formed of a transparent material. Accordingly, the opening ratio and reflectivity of the display part of the pixel 200 may be improved.

Figure 6:
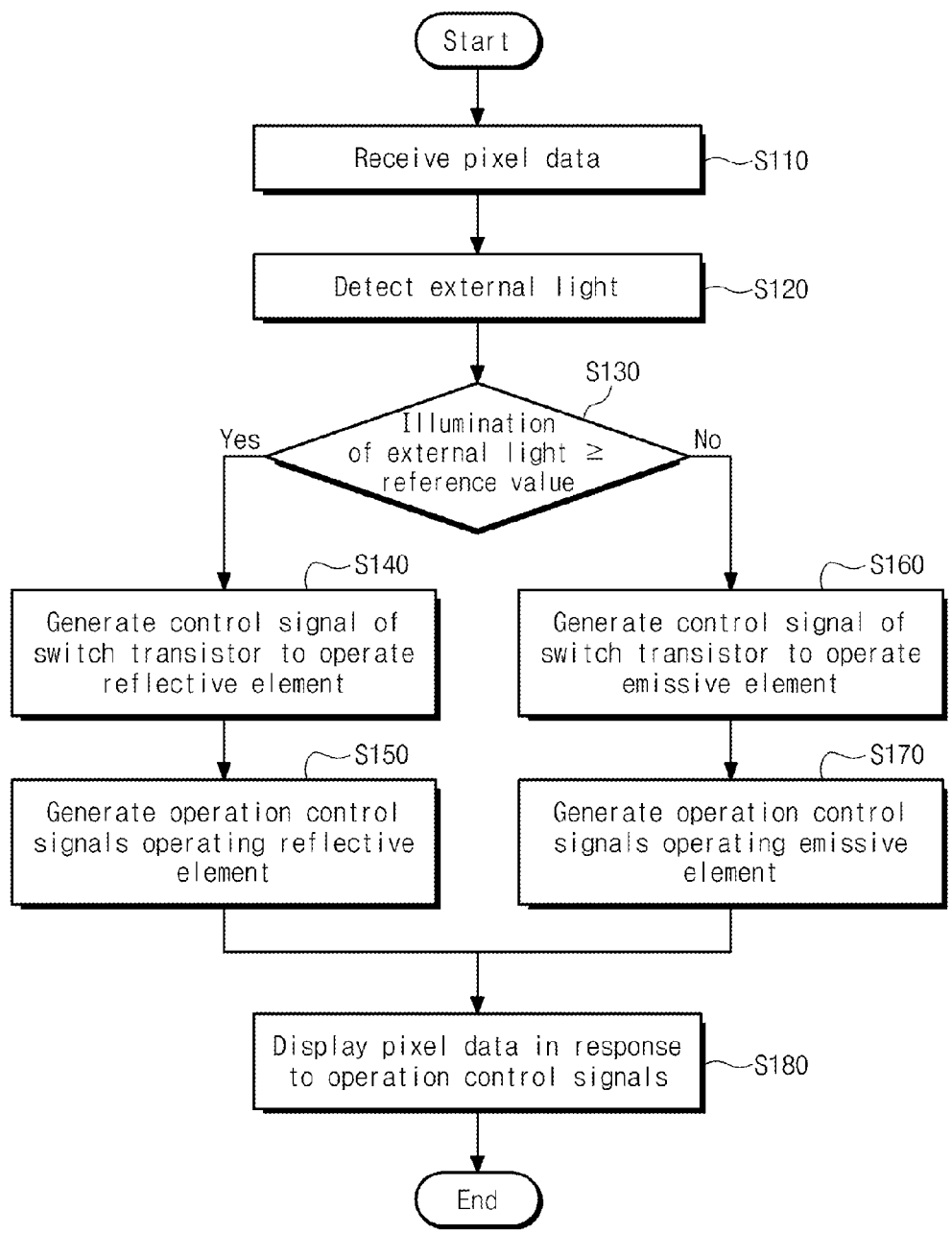
FIG. 6 is a flowchart illustrating a method of driving a display device according to an embodiment of the present invention.

FIG. 6 is a flowchart illustrating a method of driving a display device according to an embodiment of the present invention. Referring to FIGS. 1, 2, and 6, the display device 100 may selectively drive the emissive element circuit 111 or the reflective element circuit 112 according to an illumination of an external light source.

In operation S110, the controller 120 may receive pixel data. The controller 120 may generate a data signal Vdata for driving the pixel according to the received pixel data.

In operation S120, the illumination sensor 130 may detect an external light source. The illumination sensor 130 may generate an illumination information signal Light_sig according to the illumination of the detected external light source. The illumination information signal Light_sig may include information on an illumination of the external light source.

In operation S130, the controller 120 may compare the illumination of the external light source with a preset reference value according to the received illumination information signal Light_sig. According to a comparison result, if the illumination of the external light source is greater than the reference value, it proceeds to operation S140. According to the comparison result, if the illumination of the external light source is less than the reference value, it proceeds to operation S160.

In operation S140, if the illumination of the external light source is greater than the reference value, the controller 120 may generate a control signal of a switch transistor for operating the reflective element D1. The first transistor T1 may serve as a switch transistor. The controller 120 may generate a light signal Vlight of a high level High by turning on the first transistor T1. When the first transistor T1 is turned on, the reflective element D1 may be driven.

In operation S150, the controller 120 may generate operation control signals for operating the reflective element D1. The operation control signals may include an emission signal VDD, a scan signal Vscan, a data signal Vdata, and a common signal Vcom. The emission signal VDD may be generated in a ground level in order not to driving the emissive element D2.

The scan signal Vscan may be generated as a signal in a pulse form changing from a low level Low to a high level High in a predetermined period in order to turn on the second transistor T2 and the third transistor T3. The data signal Vdata may be generated as a signal in a pulse form for performing an inversion operation on between a high level High and a low level Low in synchronization with the scan signal Vscan so as to drive the reflective element D1. The common signal Vcom may be generated as a signal having a constant level between a high level High and a low level Low in correspondence to the data signal Vdata.

In operation S160, if the illumination of the external light source is less than the reference value, the controller 120 may generate a control signal of a switch transistor for operating the emissive element D2. The first transistor T1 may serve as the switch transistor. The controller 120 may generate a light signal Vlight of a low level Low in order to turn off the first transistor. When the first transistor is turned off, the reflective element D1 may not be driven.

In operation S170, the controller 120 may generate operation control signals in order to operate the emissive element D2. The operation control signals may include an emission signal VDD, a scan signal Vscan, and a data signal Vdata. The emission signal VDD may be generated in a high level High in order to drive the emissive element D2. The scan signal Vscan may be generated as a signal of a pulse form changing from a low level Low to a high level High in a constant period in order to turn on the third transistor T3. The data signal Vdata may be generated as a signal in a pulse form changing from a middle level Mid to a high level High in synchronization with the scan signal Vscan in order to turn on the fourth transistor T4. For example, when the emissive element D2 is an organic light emitting diode OLED, the data signal Vdata may be generated as a signal of a pulse form changing from a ground level into a high level High.

In operation S180, in response to operation control signals, the pixel 110 may display pixel data. According to operation S130 to operation S170, the reflective element D1 or the emissive element D2 of the pixel 110 may be selectively driven in response to the light signal Vlight. The selected reflective element D1 or emissive element D2 of the pixel 110 may be driven in response to operation control signals.

As described above, the display device 100 may selectively drive an emissive element and a reflective element according to an illumination of an external light source by detecting the external light source. The emissive display device has a higher visibility in a dark external environment. The visibility of the emissive display device is deteriorated in a bright external environment. A large amount of power is consumed in order to improve the visibility of the emissive display device in a bright external environment. On the contrary, the reflective display device has a higher visibility in a bright external environment compared to a dark external environment. Accordingly, when the emissive element circuit 111 and the reflective element circuit 112 are selectively driven according to an illumination of an external light source, the visibility of the display device 100 may be improved. Additionally, the power consumption of the display device 100 may be reduced.

Additionally, the reflective element D1 or the emissive element D2 of the pixel 110 may be selectively driven in response to the light signal Vlight. The first transistor T1 turned on or turned off according to the light signal Vlight may serve as a switch. The reflective element D1 and the emissive element D2 may share a wire of the scan signal Vscan by such a first transistor T1. Additionally, the emissive element circuit 111 and the reflective element circuit 122 may share a wire of the data signal Vdata. Therefore, the number of wires necessary for the pixel 110 may be reduced. Once an area by a wire is reduced, the opening ratio of a pixel may be improved. Once the opening ratio of a pixel is improved, the visibility of the display device 100 may be improved.

According to an embodiment of the present invention, a display device selecting a reflective element circuit or a light emitting element circuit according to an external illumination environment by a switch transistor and its driving method are provided. The reflective element circuit and the light emitting element circuit may share an input line of control signals by the switch transistor. Accordingly, a pixel of the display device may have an improved opening ratio due to a reduced wiring area.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
a pixel including:
an emissive element circuit;
a reflective element circuit;
a first transistor serving as a switch transistor that selects one of the emissive element circuit and the reflective element circuit;
a second transistor that is connected to the reflective element circuit, and is turned on or off in response to a scan signal when the first transistor is turned on;
a third transistor that is turned on or off in response to a scan signal when the first transistor is turned off, the reflective element circuit being driven in response to a data signal through the second and third transistors; and
a fourth transistor that is connected to the emissive element circuit, the emissive element circuit being driven in response to an emissive signal through the fourth transistor;
an illumination sensor that generates an illumination information signal based on an illumination from an external light source; and
a controller that generates control signals including the scan signal, the data signal, and the emission signal, for driving the pixel, and generates a light signal controlling the switch transistor by referencing the illumination information signal.

2. The display device according to claim 1, wherein the controller compares a preset reference value with the illumination from the external light source.

3. The display device according to claim 2, wherein when the illumination from the external light source is greater than the reference value, the controller generates the light signal to allow the switch transistor to select the reflective element circuit.

4. The display device according to claim 2, wherein when the illumination from the external light source is less than the reference value, the controller generates the light signal to allow the switch transistor to select the emissive element circuit.

5. The display device according to claim 1, wherein the reflective element circuit is connected to a source of the switch transistor.

6. The display device according to claim 5, wherein when the illumination from the external light source is greater than the reference value, the light signal is inputted to a gate of the switch transistor as a high level to turn on the switch transistor thereby driving the reflective element circuit.

7. The display device according to claim 5, wherein when the illumination from the external light source is less than the reference value, the light signal is inputted to a gate of the switch transistor as a low level to turn off the switch transistor thereby blocking the reflective element circuit.

8. A method of driving a display device including an emissive element circuit, a reflective element circuit, and first to fourth transistors, the second transistor being connected to the reflective element circuit, the fourth transistor being connected to the emissive element circuit, the method comprising:

measuring an illumination from an external light source;

comparing a preset reference value with the illumination from the external light source;

according to a comparison result, generating a light signal for controlling the first transistor serving as a switch transistor;

selecting one of the emissive element circuit and the reflective element circuit in response to the light signal; and driving the selected one of the emissive element circuit and the reflective element circuit, wherein the driving the reflective element circuit includes turning on the first transistor in response to the light signal, turning on or off the second and third transistors in response to a scan signal, and driving the reflective element circuit in response to a data signal through the second and third transistors, and wherein the driving the emissive element circuit includes turning off the first and second transistors in response to the light signal, turning on or off the third transistor in response to the scan signal, and driving the emissive element circuit in response to an emissive signal through the fourth transistor.

9. The method of claim 8, wherein the comparing of the preset reference value with the illumination from the external light source comprises, when the illumination from the external light source is greater than the reference value, selecting the reflective element circuit by the switch transistor.

10. The method of claim 8, wherein the comparing of the preset reference value with the illumination from the external light source comprises, when the illumination from the external light source is less than the reference value, selecting the emissive element circuit by the switch transistor.

11. The display device according to claim 1, wherein the illumination sensor generates an illumination information signal based on an illumination from the external light source by detecting the external light source.

* * * * *